United States Patent [19]

Crawford

[11] Patent Number: 4,586,005

[45] Date of Patent: Apr. 29, 1986

[54] ENHANCED ANALOG PHASE INTERPOLATION FOR FRACTIONAL-N FREQUENCY SYNTHESIS

[75] Inventor: James A. Crawford, Fullerton, Calif.

[73] Assignee: Hughes Aircraft Company, Los Angeles, Calif.

[21] Appl. No.: 756,148

[22] Filed: Jul. 16, 1985

[51] Int. Cl.[4] ............................................. H03L 7/06
[52] U.S. Cl. ..................................... 331/1 A; 331/17; 331/25
[58] Field of Search ..................... 331/1 A, 10, 17, 25; 375/120

[56] References Cited

U.S. PATENT DOCUMENTS 4,184,068  1/1980  Washburn ...................... 331/1 A X
4,525,685  6/1985  Hesselberth et al. .............. 331/25 X
4,536,718  8/1985  Underhill ......................... 331/17 X Primary Examiner—Eugene R. LaRoche
Assistant Examiner—D. C. Mis
Attorney, Agent, or Firm—Thomas A. Runk; Anthony W. Karambelas

[57] ABSTRACT

An analog phase interpolator for use in Fractional-N frequency synthesis is disclosed. The interpolator employs a precision gating circuit adapted to generate analog signals indicative of a precisely determined time interval. The signals switch a precision correction current to precisely compensate for the phase detector "beat note" to reduce the magnitude of FM spurious signals. The time interval is inversely proportional to the synthesizer output frequency and the gating circuit automatically compensates for changes in the output frequency. The precision gating circuit includes a prescaler circuit for prescaling the output signal frequency to provide a clock signal, and is responsive to an "initiate" pulse to provide two pulses delayed by a predetermined number of clock signal periods. A very high degree of time integrity exists in the relation of the edges of the two pulses. The same edges of the pulse are used to derive a gating signal which gates the correction current into an integrating capacitor for the time interval defined between these corresponding edges, to minimize errors resulting from different propagation delays and slew rates.

19 Claims, 5 Drawing Figures

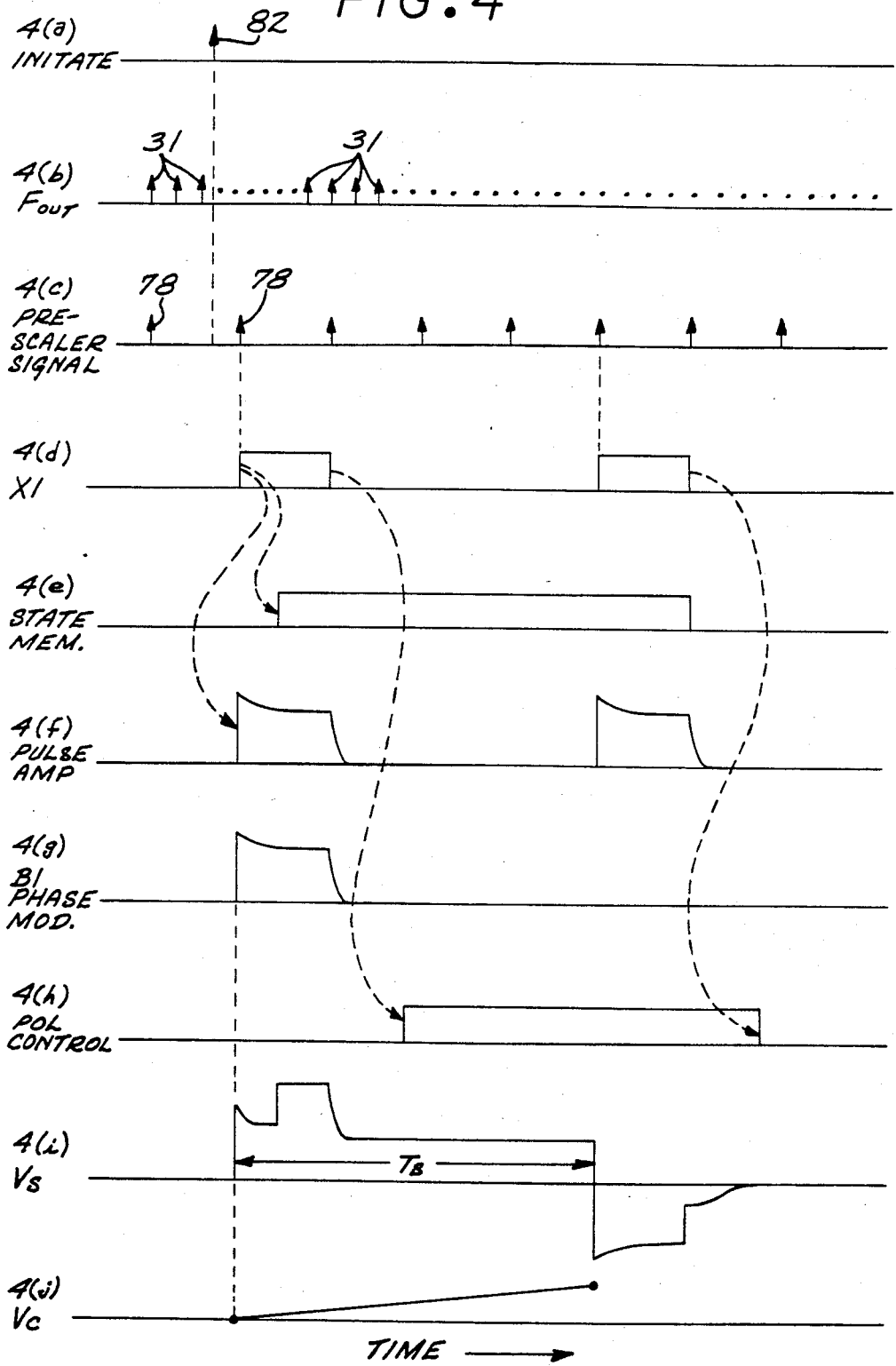

ENHANCED ANALOG PHASE INTERPOLATION FOR FRACTIONAL-N FREQUENCY SYNTHESIS

BACKGROUND OF THE INVENTION

The present invention relates to Fractional-N frequency synthesis, and in particular to techniques for generating precise timing signals.

Fractional-N frequency synthesis is a synthesis technique commonly employed today. The technique has been extensively described in the literature, for example, "The Digiphase Synthesizer," by Garry C. Gillette, a paper presented in 1969 at the twenty-third Annual Frequency Control Symposium; "Low-Noise Frequency Synthesizers Using Fractional N Phase-Locked Loops," Ulrich Rhode, RF Design, January/February 1981, pp. 20-34; "A Synthesized Signal Source with Functional Generator Capability," Dan D. Danielson and Stanley E. Froseth, Hewlett-Packard Journal, January, 1979, pp. 18-26; "Frequency Synthesis: Techniques and Applications," J. Gorski-Popiel, IEEE Press, 1975; and "Frequency Synthesis by Phase Lock," William F. Egan, John Wiley & Sons, 1981.

As is well known, Fractional-N synthesis utilizes a phase lock loop (PLL) with a variable-ratio programmable divider whose average division ratio is the sum of an integer and a fraction of an integer. A reference oscillator circuit provides a reference frequency $F_{ref}$ to a phase detector and comparator. The output of a voltage controlled oscillator (VCO) is coupled through the variable ratio divider circuit to the phase detector, and the error signal from the phase detector controls the VCO. A divider circuit which has a fractional component F is required to lock the VCO to a fractional multiple of the reference frequency. The variable-ratio divider is adapted to divide by $N_1$ for a number of cycles of the VCO signal and then momentarily divides by $N_1-1$ or $N_1+1$. The division by $N_1-1$ is required at the instant the phase of the VCO signal differs by 360° from the phase of the signal under locked conditions. Setting the divider to divide by $N_1-1$ is equivalent to advancing the output of the variable-ratio divider by one VCO cycle.

A phase interpolator is typically used to generate the signal which controls the variable-ratio divider circuit. The interpolator generates a carry or overflow signal at exactly the instant at which the division ratio is changed. One way of implementing the division-ratio change is to employ a "pulse-swallower" circuit which removes one VCO pulse.

Fractional-N synthesis results in the VCO signal phase changing periodically, with the period determined by the magnitude of F, the fractional component of N. The phase comparator will generate a spurious beat note whose rate is equal to the rate of $N_1-1$ division. The beat note is substantially cancelled by synthesis of an analog signal with a waveform and rate equivalent to the spurious beat note. This signal may be inverted and summed with the phase detector output in a sum circuit to drive the VCO, typically through a loop filter.

The extent to which the spurious beat signal is cancelled depends on the magnitude of error made in generating the cancellation signal. The error in turn generates FM spurious signals, i.e., sidebands or spurs.

A desirable feature of programmable synthesizers is the ability to rapidly switch from one programmed frequency to another. To obtain high speed frequency switching, it is necessary to employ a high reference frequency. Because the period of the high reference frequency is shorter, this requires that the correction to the phase detector signal or ramp also must be performed within a shorter period. If the phase detector ramp is not cancelled, the resultant signal will have a spectral content including very appreciable sidebands or spurs.

Prior art phase interpolators have employed either highly accurate D/A convertors to generate an analog signal similar in shape and identical in frequency and phase with the spurious beat note, or a current integration scheme, wherein the performance is limited by the current gating waveform time integrity when the reference frequency is very high, greater than 1 MHz. Both techniques have been insufficient to support Fractional-N synthesis with high reference signal frequencies.

The most accurate analog phase interpolation methods integrate a precision current for a period of time inversely proportional to the VCO frequency. This is done each reference period and effectively presets the linear phase detector ramp voltate in anticipation of the phase detector beat note caused by pulse swallowing. At high reference frequencies, generation of an accurate gating signal which is inversely proportional to the VCO frequency is difficult because of different gate delays and different positive and negative slew rates.

The difficulty may be appreciated by considering a specific example. The amplitude of the FM spurs is 20 log of one half the peak phase deviation. For an analog phase interpolator employing a precision current source to develop the correction signal, the required accuracy in the correction current is 0.1% to obtain a maximum spur level 60 db below the amplitude at the signal frequency. The correction voltage $V_c$ follows the relationship $V_c = IC \Delta t$, where $\Delta t$ is the integration time during which the precision current I charges an integration capacitor C. A typical integration time may be 200 nanoseconds. Thus, the integration time must be accurate at least to within 200 picoseconds to obtain a maximum spur level of 60 db below the synthesized signal. The difficulty in achieving this precision in gating time from a flip-flop circuit may be appreciated by recognizing the smallest available differences in the rise and fall times of a flip-flop (11C06 ECL) is 0.5 nanoseconds. This difference alone is more than twice the available time error allowable.

It is an object of the present invention to provide a frequency synthesizer employing Fractional-N synthesis with reference signal frequencies well into the Megahertz range, and having improved spurious performance.

Another object of the invention is to provide a frequency synthesizer having small channel spacing and high switching speeds from one channel to another.

It is a further object of the invention to provide a gating waveform with a very high degree of time integrity.

SUMMARY OF THE INVENTION

An improved analog phase interpolator for a Fractional-N frequency synthesizer is disclosed. The invention comprises an improved gating circuit for gating the correction current to an integrating capacitor so as to develop the correction voltage for cancelling the beat note which would otherwise result from Fractional-N synthesis. The gating circuit gates the correction current into the integrating capacitor for a precisely determined time interval once during each cycle of the reference signal. The duration of the time interval is inversely proportional to the output frequency of the synthesizer, and is substantially unaffected by the timing uncertainties due to different propagation delays and different positive and negative slew rates of the active devices comprising the gating circuit. The improvement allows the use of much higher reference signal frequencies, allowing small channel spacing and very high switching from one channel to another while maintaining very good spurious signal performance.

The phase interpolator comprises (i) a means for generating an initiate pulse once during each cycle of the reference signal, (ii) a precision current source adapted to supply a correction current, and (iii) a precision gating means adapted to generate gating signals for gating the correction current to an integrating capacitor for an accurately determined time interval once during each reference signal cycle. In the preferred embodiment, the gating means comprises (i) a prescaler divider for dividing the synthesizer output frequency to provide a clock signal, (ii) a pulse generating means responsive to the initiate signal for providing a first pulse signal in response to said initiate signal and a second pulse signal a predetermined number of clock cycles after the first pulse signal, and (iii) means responsive to either the respective leading or trailing edges of the first and second pulses for generating the gating signals so that the correction current is integrated for the duration of the time interval between the respective edges of the pulse signals.

One aspect of the invention resides in the fact that a very high degree of time integrity exists between the respective corresponding edges of the first and second pulse signals. These edges of the pulse signals are used for accurate timing, thereby avoiding the time uncertainties due to different propagation delays and different positive and negative slew rates of the active devices.

BRIEF DESCRIPTION OF THE DRAWINGS

These and other features and advantages of the invention will become more apparent from the following detailed description of an exemplary embodiment thereof, as illustrated in the accompanying drawings, in which:

FIGS. 4(a)-(k) are timing diagrams illustrative of the operation of the precision gating circuitry of the preferred embodiment.

DETAILED DESCRIPTION OF THE PREFERRED EMBODIMENT

The present invention comprises a novel phase interpolation circuit usable in Fractional-N frequency synthesis. The following description is presented to enable a person skilled in the art to make and use the invention, and is provided in the context of a particular application and its requirements. Modifications to the preferred embodiment may be apparent to those skilled in the art, and the generic principles defined herein may be applied to other embodiments and applications. The present invention is not intended to be limited to the embodiment shown, but is to be accorded the widest scope consistent with the principles and novel features disclosed herein.

Figure 1:
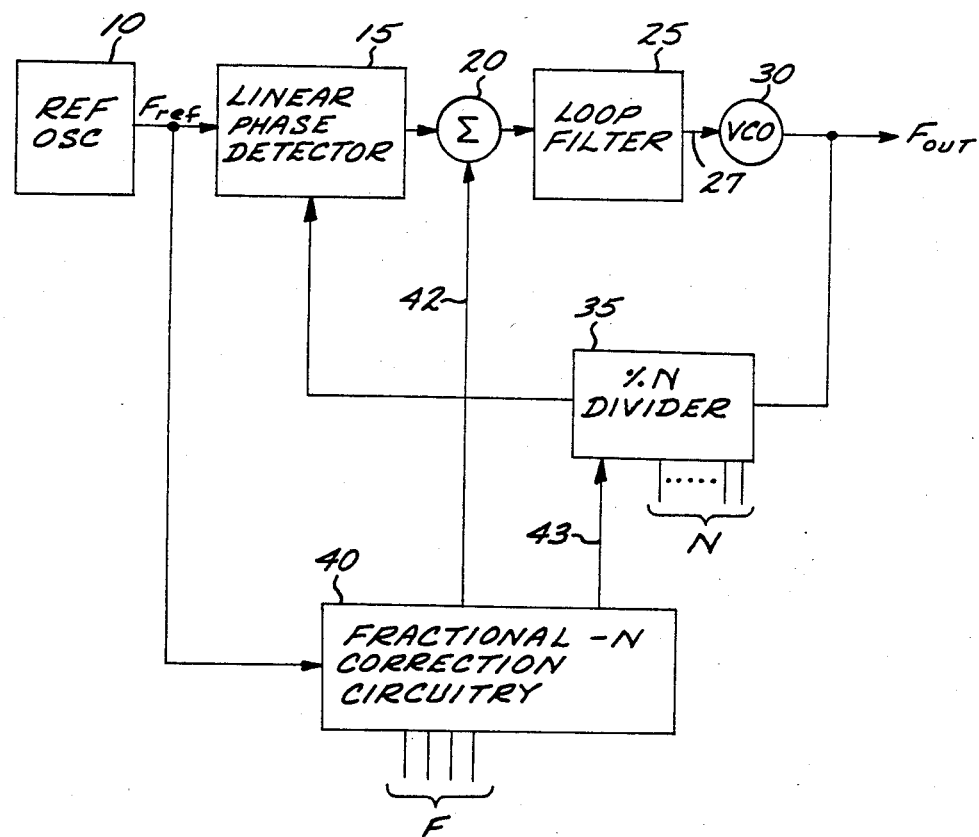
FIG. 1 is an general block diagram of a Fractional-N frequency synthesis circuit.

Referring now to FIG. 1, a block diagram of a Fractional-N frequency synthesizer is illustrated. A reference oscillator 10 generates a reference signal of reference frequency $F_{ref}$. The reference signal $F_{ref}$ is coupled to a linear phase detector 15. The output of the phase detector 15 is coupled to a summing circuit 20, whose output is filtered by a loop filter 25 to provide an error signal to a voltage controlled oscillator (VCO) 30. The output of the VCO 30 comprises a synthesizer output frequency $F_{out}$ and is coupled to a programmable divide-by-N frequency divider 35. The programmable divider 35 operates to provide an output signal whose frequency is that of the VCO 30 output divided by N. The programmable divider 35 output is coupled to the phase detector 15, thereby forming a phase-locked loop (PLL).

The fractional-N correction circuitry 40 is a programmable circuit adapted to generate a correction signal which is provided to the summing circuit 20, and a pulse swallower control signal provided on line 43 to the programmable divider 35 to cause one count or cycle to be dropped in the programmable divider 35. The correction signal applied to the summing circuit 20 on line 42 is used to correct for the beat note which will be generated in the phase detector 15 output by the dropping of a count in the programmable divider 35. The correction circuitry 40 is programmable and is controlled by a digital input representation of the particular value of the fraction F. The VCO output frequency is N.F times the reference signal frequency $F_{ref}$.

The provision of suitable means for generating the programmable signals N and F, which are representative of the desired synthesized signal frequency, are well known to those skilled in the art and are not further described herein.

Figure 2:
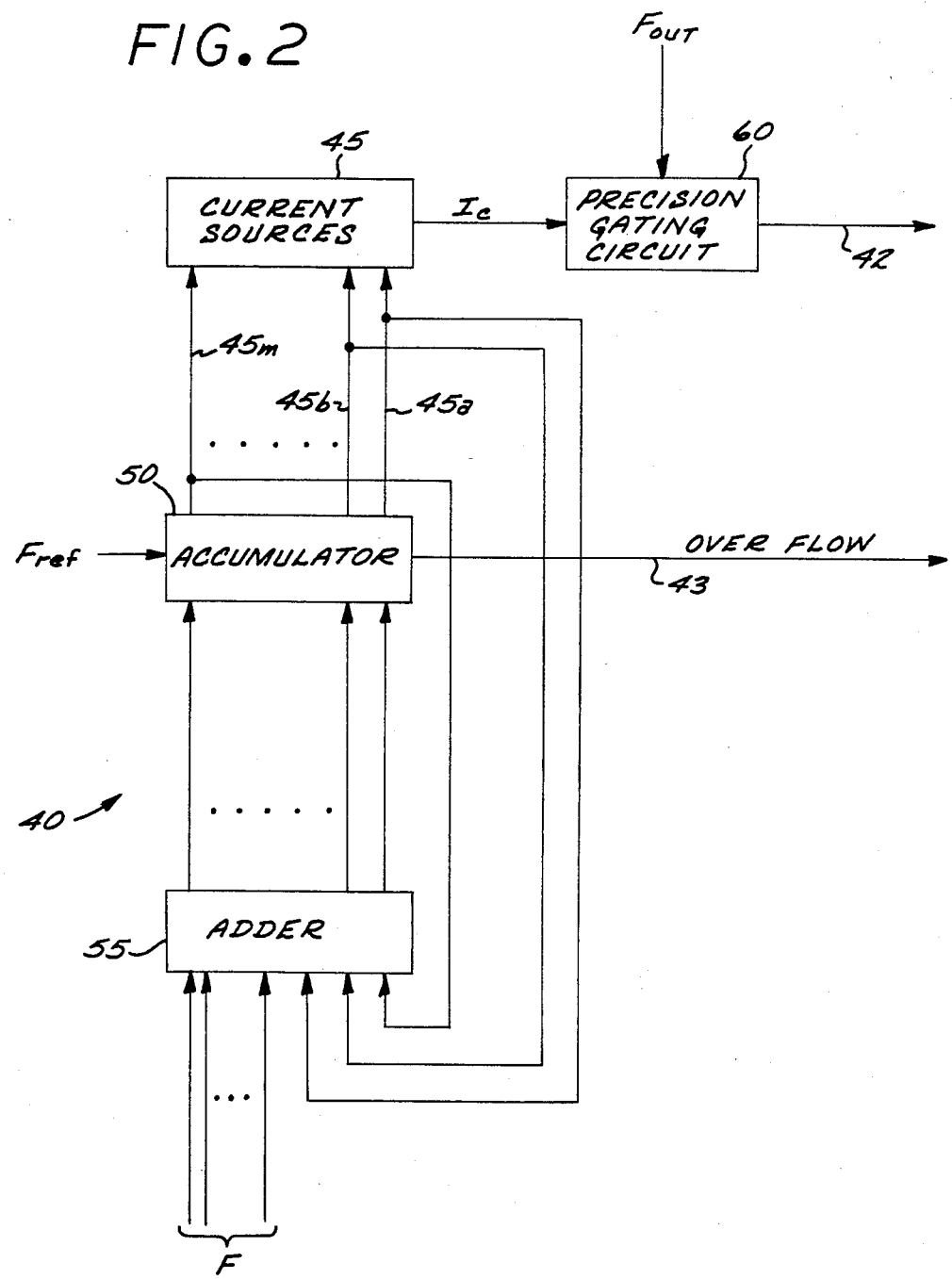
FIG. 2 is a block diagram of the Fractional-N correction circuitry employing the invention.

Referring now to FIG. 2, a block diagram is shown, illustrating the Fractional-N correction circuitry 40 employed in the overall block diagram of FIG. 1. In this embodiment, the correction signal results from the integration of precision currents over a precisely determined time interval. The current source 45 typically comprises a number M of current sources, so as to provide increased switching speed where the frequency channel spacings are large. The current source 45 comprises a precision current generator which operates to add the individual current sources to form the desired correction current $I_c$. The current source 45 is controlled by control lines 45a, 45b . . . 45m, each control line causing a corresponding precision current source output to be summed into the correction current $I_c$. The magnitudes of the individual current sources are scaled in accordance with the significance of its control line, line 45m comprising the most significant, and 45a the least significant. The precision current generator in current source 45 may comprise a monolithic array of transistors and a corresponding monolithic array of precision resistors selected to develop the appropriate current magnitude. Utilization of monolithic transistor and resistor arrays has been found to assure that variations in the respective currents produced by the individual current sources due to temperature changes are substantially uniform, which enhances accuracy of the current magnitudes. Other arrangements of the current source may be readily apparent to those skilled in the art.

An accumulator 50 controls the current source 45 and is clocked by the reference oscillator 10 signal, $F_{ref}$. The accumulator 50 is commercially available from many sources, comprising a shift register with an input latch. The content of the accumulator shift register is incremented once each reference period by the value of the input frequency word provided by an adder 55. As is known to those skilled in the art, the contents of the accumulator at a given instant of time is an exact representation of the phase error in the detector output which must be cancelled to prevent the beat note, as described above. The contents of the accumulator 50 in turn control the magnitude of the correction current to be applied to the summing circuit 20.

The adder 55 may be a commercially available product and adds the value for the fraction F required to obtain the programmed frequency to the value in the accumulator 50 shift register. The fraction F determines the amount by which the accumulator 50 shift register is incremented each reference signal period. The contents of the accumulator 50 are also coupled to the adder 55 and determine the carry value when the accumulator 50 overflows, i.e., the value at which the accumulator 50 resets after overflow.

The accumulator 50 generates an overflow signal when the overflow condition occurs, which is coupled to the programmable divider 35 to cause one count to be dropped or "shallowed" in the programmable divider 35.

The operations of the adder 55, accumulator 50 and the current sources 45 per se are conventional, and accordingly are not discussed in further detail in this application.

Figure 3:
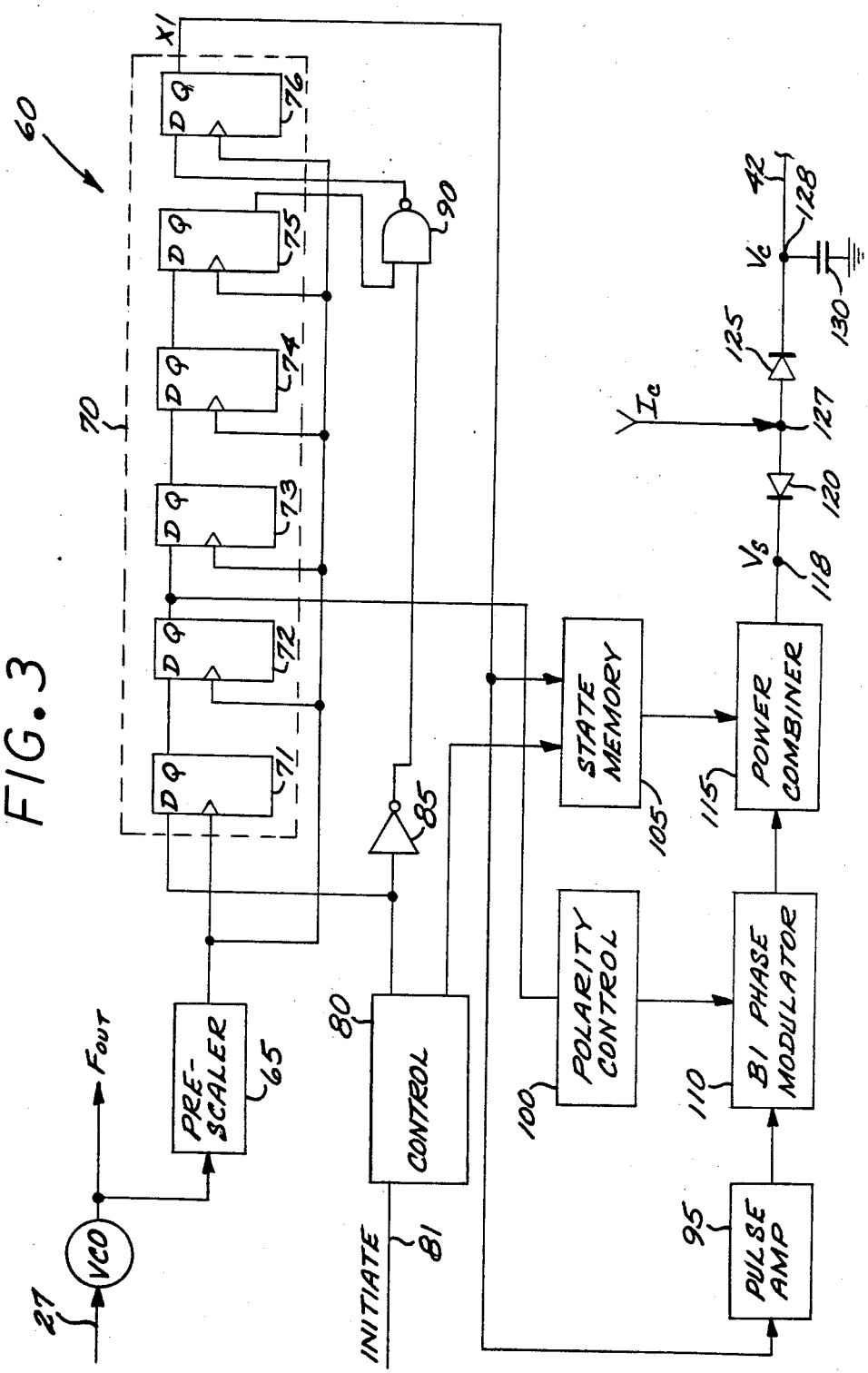
FIG. 3 is a schematic diagram of the preferred embodiment of the precision gating circuit in accordance with the invention.

The precision correction current $I_c$ is gated by a novel precision gating circuit 60 in accordance with the present invention. The preferred embodiment of this gating circuit is illustrated in FIG. 3. The gating circuit 60 is driven by an output coupled from the VCO ($F_{out}$). This may be developed by a power divider or coupler at the VCO which divides the VCO output signal power into a primary signal output and a secondary signal output, the secondary for utilization by the gating circuit 60. The secondary VCO output $F_{out}$ is divided down by a prescaler frequency divider 65 to a lower frequency. The prescaler 65 is utilized because the VCO signal frequency may be in the gigahertz range, far too high for reliable shift register operation (as presently available).

The prescaler 65 output is coupled to a shift register 70, comprising a series of flip-flops 71–76. Each flip-flop is clocked by the prescaler 65 output signal. An "initiate" pulse is provided on line 81 to a control unit 80. As will be discussed in more detail hereinbelow, the "initiate" pulse occurs once during each cycle of the synthesizer reference oscillator 10 (FIG. 1) signal, and is no longer than one period of the prescaler signal.

The control unit 80 provides a control pulse which is coupled to the D terminal of the first flip-flop 71 of the shift register 70, and is also coupled to an inverting amplifier 85, whose output is coupled to a NAND gate 90. The control unit 80 comprises an edge-triggered flip-flop unit, although for certain applications, the control unit 80 could be omitted and the "initiate" pulse coupled directly to the inverting amplifier 85 and the first flip-flop 71 of shift register 70.

The shift register 70 acts as a delay line, such that the control unit 80 pulse resulting from the "initiate" signal appears at the output of the last flip-flop 76 five prescaler signal frequency periods later.

The inverted output $\overline{Q}$ of the second to last flip-flop 75 is coupled to one input of the NAND gate 90. An output from the control unit 80 is coupled through the inverting amplifier 85 to the other input of the NAND gate 90. The output of the NAND gate 90 will be low only when both inputs are high; otherwise the NAND gate 90 output will be high. The $\overline{Q}$ output of the second to last flip-flop 75 will be high except when a high pulse has propagated through the shift register 70 to flip-flop 75 and the second to last flip-flop 75 is clocked. Similarly, the output of the inverting amplifier 85 will be high except when the output of the control unit 80 is high. Thus, the output of the NAND gate 90 will be low except when the control unit output is high or when the $\overline{Q}$ output of the second to last flip-flop 75 is high.

The control unit 80, inverting amplifier 85, the NAND gate 90 and the shift register 70 function to provide an X1 pulse at the commencement of an "initiate" pulse cycle commenced by an "initiate" pulse and provide a second X1 pulse occurring five prescaler periods later.

FIGS. 4(a)–(j) comprise a series of timing diagrams illustrating the respective timing of signals of particular elements of the gating circuit 60. In FIG. 4(a), arrow 82 represents the leading edge of the gating circuit "initiate" pulse, occurring one each cycle of $F_{ref}$. In FIG. 4(b), arrows 31 represent the low-to-high zero crossing transitions of the VCO signal $F_{out}$. In FIG. 4(c), arrows 78 represent the low-to-high zero crossing transitions of the prescaler 65 output.

FIG. 4(d) represents the X1 pulse waveform. Note that the zero-crossing transitions of the prescaler signal and the leading edge of the first X1 pulse are delayed a fraction of a prescaler cycle from the "initiate" pulse, representing the propagation delays and slew rates of the components. The first X1 pulse following the "initiate" pulse is caused by the high control unit 80 output coupled through inverting amplifier 85 to NAND gate 90. Since there are six stages in the shift register 70 of the disclosed gating circuit, the second pulse in the X1 waveform is separated from the first pulse by five prescaler 65 signal cycles.

The output of the shift register 70, i.e., the X1 waveform, is coupled to the input of a pulse amplifier 95 and a state memory 105. In the preferred embodiment, the state memory 105 comprises a flip-flop, triggered by the leading edge of the X1 waveform. Thus, the leading edges of the X1 waveforms activate the state memory 105 flip-flop, producing a state memory pulse having a width substantially residing between the leading edges of two X1 pulses occurring during a reference oscillator 10 cycle. The timing diagram of FIG. 4(e) illustrates the state memory 105 waveform and its relationship to the timing of other elements in the precision gate circuit 60. The commencement of the state memory 105 pulse follows the X1 leading edge by a delay interval caused by propagation delays and slew rates. The state memory 105 pulse terminates a similar delay interval following the leading edge of the second X1 pulse.

The pulse amplifier 95 comprises a step recovery diode adapted to amplify the X1 signal. The pulse amplifier 95 output is shown in FIG. 4(f). The leading edges of the X1 pulses activate the pulse amplifier 95, which is turned off after the X1 pulse returns to the low state.

The pulse amplifier 95 output is coupled to a bi-phase modulator 110. The bi-phase modulator 110 operation is controlled by a polarity control unit 100, so as to invert every other pulse from the pulse amplifier 95 such that the two pulses are of the opposite polarity. The bi-phase modulator 110 may comprise a commercially availble modulator; this type of device is well known to those skilled in the art. The modulator 110 output waveform is illustrated in FIG. 4(g).

The polarity control unit 100 comprises a flip-flop, whose data input is driven by the Q output from the second flip-flop 72 of the shift register 70 (FIG. 3). The polarity control unit 100 is controlled by this particular stage of the shift register 70 is avoid changing the polarity of the pulse amplifier 95 output when it is high. The polarity control unit 100 is adapted to be triggered by the falling edge of the X1 pulses. The output of the polarity control unit 100 is shown in FIG. 4(h). The low state of the polarity control unit 100 output indicates that the bi-phase modulator 110 pulse will be of positive polarity, while the high state indicates that the bi-phase modulator 110 polarity will be negative.

The bi-phase modulator 110 output and the state memory 105 output are combined by a power combiner 115 (FIG. 3) to provide a gating circuit switch node voltage $V_s$. The voltage $V_s$ is illustrated in FIG. 4(i). The time interval $T_s$ is a very accurately determined time interval, intimately tied to zero crossings in the VCO signal. Moreover, the waveform shape of $V_s$ is adapted for controlling the switching of the precision current $I_c$ into the integrating capacitor 130 (FIG. 3) for the precisely determined time interval $T_s$.

The precision correction current $I_c$ from the precision current source 45 (FIG. 2) is provided to node 127 of FIG. 3. The correction voltage $V_c$ is developed at node 128 by integration of the correction current $I_c$ by the integrating capacitor 130. Two diodes 120 and 125 are coupled to each other, anode to anode, between node 127 (anodes) and nodes 118 (cathode of diode 120) and 128 (cathode of diode 125). Thus, depending upon the respective values of the voltages $V_s$ and $V_c$, one of the diodes 120,125 will be forward biased and the other reverse biased so that correction current $I_c$ flows either through diode 125 to charge the integrating capacitor 130 or through diode 120 where it is dissipated in the power combiner 115. The arrangement of the diodes 120, 125 in combination with waveform $V_s$, thus provides a simple switch for gating the correction current into the integrating capacitor 130.

The invention makes use of the fact that a very high degree of time integrity exists in the edges of the X1 waveform. The same edges of X1, either the positive-going or negative-going, must be used for accurate time generation due to different propagation delays and slew rates.

By using the bi-phase modulator 110, one positive-going edge of the signal X1 can cause the precision current $I_c$ to start integrating on capacitor 130. The second positive-going edge of signal X1 causes the current integration to cease. The state memory 105 insures proper operation between X1 pulses. Hence, the rising and falling edges of the voltage $V_s$ are generated by the leading edges of pulses of the signal X1 which are separated by five prescaler signal periods. The total propagation delays for the leading and trailing edges of the signal $V_s$ are then identical except for picosecond differences due to different diode paths used in the modulator 110.

FIG. 4(j) illustrates the correction voltage $V_c$ developed across the integrating capacitor 130. As illustrated, the voltage integration commences upon the rising edge of the $V_s$ waveform, and linearly increases as charge is transferred to the integrating capacitor 130 until the precision current $I_c$ is gated off, i.e., at the end of the time interval $T_s$.

The correction voltage $V_c$ is applied to the summing circuit 20 (FIG. 1) to correct the phase detector 15 output prior to the sample being taken and provided to the loop filter 25 and VCO 30. The determination of the precise correction current and charge transfer necessary to accomplish the required correction are derived in the book, "Frequency Synthesis by Phase Lock," William F. Egan, John Wiley & Sons, Inc., 1981, at section 7.3, pages 196–202. The time interval $T_c$ during which the correction current is applied is inversely proportional to the output VCO frequency $F_{out}$. Thus, as shown by the Egan work, (equation 7.59), this time interval follows the relationship of the following Equation 1:

$$T_c = \frac{F}{2^f F_{out}} \qquad (1)$$

where f is the number of bits representing the fraction F which controls the correction circuitry 40 (FIG. 1). The charge transfer Q required is represented by the following Equation 2:

$$Q = \frac{I_p F}{2^f F_{out}} \qquad (2)$$

where $I_p$ is the phase error current produced by the phase detector 15 (FIG. 1).

One aspect of the invention is that the time interval $T_s$ measured by the precision gating circuit 60 (FIG. 2) is inversely proportional to the prescaler 65 (FIG. 3) signal frequency, inasmuch as the prescaler 65 signal provides the clock signal to the delay line or shift register 70. Thus, by appropriate scaling of the correction current $I_c$ magnitude, the necessary charge transfer may be obtained. Scaling is understood by those skilled in the art and is not described in further detail.

As has been described above, during each cycle of the reference oscillator 10 (FIG. 1) signal, a correction to the phase detector 15 output must be performed. The timing of the "initiate" pulse must occur at an appropriate point during the reference signal cycle so that the correction can be made before the phase detector 15 output is sampled and thereafter provided to the loop filter 25 and VCO 30 as an error signal.

As is known, the phase detector 15 is adapted to compare the low-to-high transitions of the reference signal $F_{ref}$ and the signal from programmable divider 35. Thus, each time the programmable divider 35 signal passes through such a transition, the phase detector 15 makes a comparison of the time interval between the zero crossings of the reference oscillator 10 signal and the programmable divider 35 signals. For Fractional-N operation, the time interval will linearly increase until the phase difference exceeds 360°. A sample-and-hold circuit is employed in the phase detector 15 to provide the sampled error signal to the VCO.

Figure 5:
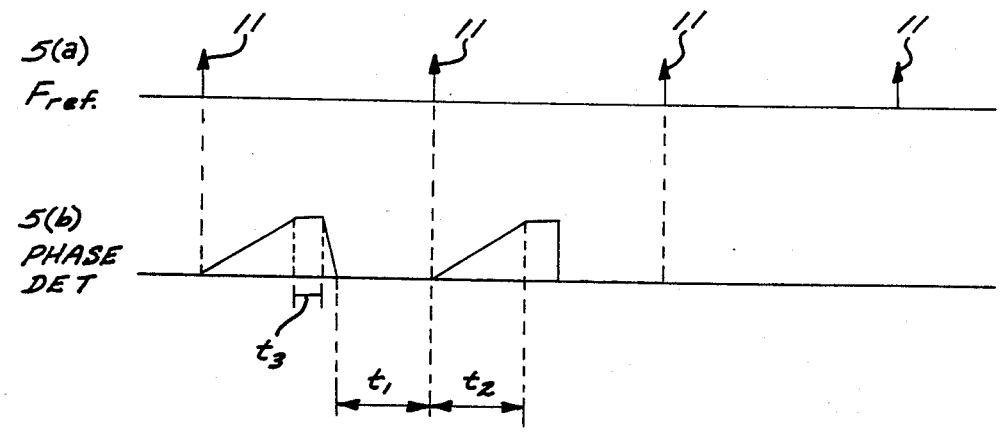
FIGS. 5(a)-(b) are timing diagrams illustrative of the required timing of the correction signal applied to correct the linear phase detector output.

The timing of the phase detector 15 sampling in relation to the reference oscillator 10 cycle is illustrated in FIGS. 5(a) and 5(b). In FIG. 5(a), the arrows 11 indicate the low-to-high zero crossings of the reference signal $F_{ref}$. FIG. 5(b) illustrates the ramp output of the linear phase detector 15 as a function of time and in relation to $F_{ref}$(FIG. 5(a)). The indicated time interval $t_3$ represents the interval during which the detector 15 output is sampled. The correction from the correction circuitry 40 (FIG. 1) must be applied either during the interval $t_1$, i.e., after the sampling has occurred but before the next reference signal zero crossing; during time interval $t_2$, i.e., while the phase detector is ramping up; or in combination during the two intervals $t_1$, $t_2$. The basic rules are that the correction to the phase detector ramp signal must be applied before the sample is taken, and that the reset of the phase detector ramp signal cannot interfere with the correction process. The timing of the "initiate" pulse during each reference pulse is selected to conform to these basic criteria.

The number S of stages in the shift register 70 (FIG. 3) and the modulus M of the prescaler divider 65 are determined by the lower and upper frequency limits of the synthesizer operation, and the reference signal frequency. By way of example, assume that the reference signal frequency $F_{ref}$ is 100 Khz, and that the synthesizer is to tune between 70 Mhz and 100 Mhz. The period of the reference signal is 10 microseconds, and the period of the synthesizer signal may range from 1/70 Mhz to 1/100 Mhz. To determine the modulus M of the prescaler divider 65, the longest possible VCO 30 cycle period is examined, i.e., 1/70 Mhz or about 14 nanoseconds.

Since the full cycle period of the reference signal is 10 microseconds, it may be assumed that only about one-half the cycle length, 5 microseconds is available for the correction. If only one stage is used in the shift register 70, the modulus $M_o$ for this condition is approximately equivalent to 5 microseconds/14 nanoseconds, or about 357. For a shift register 70 with S stages, the relationship between M, $M_o$ and S is given by the following Equation 3.

$$M = M_o/S \qquad (3)$$

For S=6, and $M_o$=357, M is about 60.

In a general sense the number of stages S of the shift register 70, an appropriate modulus M of the prescaler divider 65, and the lowest output signal frequency $F_{min}$ of the synthesizer are related by the relationship of Equation 4:

$$M = [F_{min}/2SF_{ref}] \qquad (4)$$

where [p] represents the integer closest to p.

An improved analog phase interpolator for Fractional-N frequency synthesis has been described. The invention enables Fractional-N synthesis with reference frequencies well into the MHz range while preserving good spurious performance. A further advantage of the invention is that synthesizers having small channel spacing and very rapid switching speed are made possible.

Although an embodiment of the invention has been described and shown in detail, it is anticipated that modifications and variations may occur to those skilled in the art which do not depart from the inventive concepts. It is intended that the invention be limited only by the scope of the claims, not by the description, and the invention will include such modifications and variations unless the claims limit the invention otherwise.

What is claimed is:

1. An improved analog phase interpolator for a Fractional-N frequency synthesizer employing a reference signal having a frequency $F_{ref}$, a phase-locked loop comprising a phase detector and a voltage controlled oscillator and providing an output signal having an output signal frequency $F_{out}$, comprising:

a current source means for generating a correction current;

integrating means for selectively integrating said correction current in response to a gating signal to develop a precise correction voltage for correcting the phase detector output;

initiate signal means for generating an initiate signal once during each cycle of the reference signal; and gating circuit means for generating gating signals responsive to said initiate signal, comprising:

(i) clock signal means for providing a clock signal having a frequency which is an integral submultiple of the output signal frequency;

(ii) pulse generating means for providing a first pulse signal in response to said initiate signal and for providing a second pulse signal a predetermined number of clock cycles after said first pulse signal; and (iii) means responsive to either the respective leading or trailing edges of said first and second pulses for generating said gating signals, thereby causing said integrating means to integrate said correction current during the time interval defined between said respective pulse edges, whereby said correction current is integrated to provide a correction voltage whose magnitude is dependent on the magnitude of said correction current and the length of said time interval.

2. The invention of claim 1 wherein said pulse generating means comprises a digital shift register means clocked by said clock signal, said shift register means comprising an output stage responsive to said initiate signal and to the output of the preceding stage of said shift register means for generating said first and second pulse signals.

3. The invention of claim 2 wherein said shift register means comprises a plurality of S cascaded flip-flop stages, each respectively clocked by said clock signal, and wherein the input of the first stage is responsive to said initiate signal, whereby said shift register means is adapted to generate said first pulse in response to said initiate signal and to generate said second pulse (S-1) clock cycles following said first timing pulse.

4. The invention of claim 3 wherein said clock signal means comprises a frequency divider means for providing a clock signal whose frequency is equal to the output signal frequency $F_{out}$ divided by an integer M.

5. The invention of claim 4 wherein the number of stages S, the modulus M of the frequency divider and the lowest output signal frequency $F_{min}$ of the synthesizer are related by the following relationship:

$$M = [F_{min}/2SF_{ref}],$$

where the notation [p] represents the integer closest to p.

6. The invention of claim 1 wherein said integrating means comprises an integrating capacitor means and switching means responsive to said gating signals for selectively gating said correction current to said integrating capacitor means.

7. The invention of claim 6 wherein said switching means comprises voltage responsive means for switching said current to said integrating capacitor means when the voltage level of said gating signal is above a predetermined level, and for switching said current to a current sinking means when the voltage level of said gating signal is below said predetermined threshold level.

8. The invention of claim 7 wherein said switching means comprises first and second diode means, and wherein the anodes of said diodes and said current source means are coupled at a first node, the cathode of said first diode is coupled to said gating circuit means to receive said gating signals, and the cathode of said second diode is coupled to said integrating capacitor, whereby said correction current passes through said second diode to said integrating capacitor when said first diode is reverse biased by the gating signal, and the correction current passes through said first diode when said first diode is forward biased by said gating signal.

9. In a Fractional-N frequency synthesizer comprising:
- a reference oscillator for providing a reference signal having a reference frequency $F_{ref}$;
- a voltage controlled oscillator (VCO) for providing a synthesizer output signal have a frequency $F_{out}$;
- a progammable divide-by-N frequency divider coupled to said output signal for providing a divider signal;
- phase detector means coupled to the reference oscillator and said divider for comparing the phase of said reference signal and said divider signal and providing a phase detector signal indicative of the relative phase between said signals, said detector signal coupled to said VCO to control the frequency of the output signal;
- Fractional-N correction circuitry for providing a first correction signal to said divider to cause said divider to drop selected ones of the cycles of said output signal and for providing a second correction signal for compensating for the effect on said error signal resulting from said first correction signal; and
- summing means for summing said detector signal and said second correction signal and providing a corrected detector signal to said VCO, the improvement comprising a gating circuit for providing precise second correction signals to said summing means to enable relatively high reference frequencies while maintaining good spurious performance, comprising:
- initiate signal means for providing an initiate signal once during each cycle of said reference signal;
- digital pulse generating means for generating a first pulse signal in response to said initiate signal and a second pulse signal a time interval after said first pulse signal, the length of said time interval being inversely proportional to the period of the synthesizer output signal; and
- converting means for converting the first and second pulse signals into a gating signal for deriving said second correction signal, and the gating signal duration being dependent on the time interval between corresponding leading or trailing edges of said first and second pulse signals.

10. The improvement of claim 9 wherein said pulse generating means comprises:
- a clock signal generator coupled to said output signal for providing a clock signal having a frequency $F_{out}/M$, where M is a predetermined integer scale factor;
- shift register means comprising a plurality of cascaded flip-flop devices, each of said devices clocked by said clock signal, said initiate pulse coupled as an input of said shift register means and to the last flip-flop device comprising said shift register,
- whereby the shift register output changes states when clocked after the occurrence of said initiate signal to provide said first pulse signal, and changes states again when clocked after said initiate signal has propagated to said last flip-flop device to provide said second pulse signal.

11. The improvement of claim 9 wherein pulse generating means comprises:
- a clock signal generator coupled to said output signal for providing a clock signal having a frequency ($F_{out}/M$), where M represents an integer;
- digital circuit means clocked by said clock signal and responsive to said initiate signal to provide said first pulse signal when clocked by the clock signal after the occurrence of said initiate signal and to provide said second pulse signal a predetermined number of cycles of said clock signals after said first pulse signal,
- whereby the duration of said time interval between said corresponding edges of said first and second pulse signals is equivalent to the duration of M-1 clock cycles.

12. The improvement of claim 11 wherein said converting means comprises:
- modulator means for inverting a predetermined one of said pulse signals;
- biasing means for providing a bias signal pulse once during each cycle of said reference signal, commencing between the leading and trailing edges of said first pulse signal and ending after the leading edge of said second pulse; and
- signal combining means for adding said bias signal and said first and second pulse signals to provide said gating signal, whereby the magnitude of said gating signal exceeds a predetermined threshold level for said time interval.

13. The improvement of claim 12 wherein said biasing means comprises a flip-flop device responsive to said first and second pulse signals, whereby the output of said flip-flop changes states from a first state to a bias level state in response to said first pulse signal, and changes states from said bias level state to said first state in response to said second pulse signal.

14. An improved analog phase interpolator in a Fractional-N frequency synthesizer for enabling high reference signal frequencies while providing good spurious signal performance, comprising:
- a clock signal generator means responsive to the synthesizer output signal for providing a clock signal with a clock frequency which is an integral submultiple of the frequency of said output signal;
- an initiate means responsive to said reference signal for providing an initiate pulse once during each cycle of said reference signal;
- a digital pulse generator clocked by said clock signal and responsive to said initiate signal to provide a first pulse signal in response to said initiate signal and a second pulse signal whose leading edge lags the leading edge of said first pulse signal by a predetermined number of clock cycles;

current source means for providing a precision correction current signal;

integrator means for selectively integrating said correction current signal in response to a gating signal for providing a phase correction signal; and a gating signal circuit responsive to said first and second pulse signals to provide a gating signal whose waveform defines a gating time interval whose duration is equivalent to the time duration of said predetermined number of clock cycles.

15. The invention of claim 14 wherein said digital pulse generator comprises a digital shift register having a plurality of S stages, wherein the input stage is responsive to said initiate signal and the output stage is responsive to said initiate signal and to the output of the next to last stage, whereby said shift register output comprises a first pulse signal response to said initiate signal and a second pulse signal S-1 clock cycles after said first pulse signal.

16. The invention of claim 14 wherein said gating signal circuit comprises:

bi-phase modulator means for inverting said second pulse signal;

biasing means for providing a bias signal pulse once during each cycle of said reference signal, said bias signal pulse commencing between the leading and trailing edges of said first pulse signal and ending after the leading edge of said second pulse; and signal combining means for adding said bias signal and said first and second pulse signals to provide said gating signal.

17. The invention of claim 16 wherein said integrating means comprises an integrating capacitor means responsive to said gating signal for selectively gating said correction current to said integrating capacitor means.

18. The invention of claim 17 wherein said switching means comprises voltage responsive means for switching said correction current to said integrating capacitor means when the voltage level of said gating signal is above a predetermined level, and for switching said current to a current sinking means when the voltage level of said gating signal is below said predetermined threshold level.

19. The invention of claim 18 wherein said switching means comprises first and second diode means, and wherein the anodes of said diodes and said current source means are coupled at a first node, the cathode of said first diode is coupled to said gating circuit means to receive said gating signal, and the cathode of said second diode is coupled to said integrating capacitor, whereby said correction current passes through said second diode to said integrating capacitor when said first diode is reverse biased by the gating signal, and the correction current passes through said first diode means to said current sinking means when said first diode is forward biased by said gating signal.

* * * * *